United States Patent
Li et al.

(10) Patent No.: US 6,660,136 B2
(45) Date of Patent: Dec. 9, 2003

(54) METHOD OF FORMING A NON-VOLATILE RESISTANCE VARIABLE DEVICE AND METHOD OF FORMING A METAL LAYER COMPRISING SILVER AND TUNGSTEN

(75) Inventors: Jiutao Li, Boise, ID (US); Shane P. Leiphart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 10/109,421

(22) Filed: Mar. 27, 2002

(65) Prior Publication Data

US 2003/0183507 A1 Oct. 2, 2003

(51) Int. Cl.$^7$ .......................... C23C 14/35; C23C 14/34
(52) U.S. Cl. ........................ 204/192.17; 204/192.13; 204/192.15
(58) Field of Search .................. 204/192.13, 192.15, 204/192.17

(56) References Cited

U.S. PATENT DOCUMENTS

| | | | |
|---|---|---|---|
| 4,536,482 A | 8/1985 | Carcia | 502/5 |
| 5,360,981 A | 11/1994 | Owen et al. | 257/4 |
| 5,738,947 A | 4/1998 | Hijikata et al. | 428/629 |
| 5,761,115 A | 6/1998 | Kozicki et al. | 365/182 |
| 5,896,312 A | 4/1999 | Kozicki et al. | 365/153 |
| 5,914,893 A | 6/1999 | Kozicki et al. | 365/107 |
| 5,948,497 A | 9/1999 | Hatwar et al. | 428/64.2 |
| 6,084,796 A | 7/2000 | Kozicki et al. | 365/153 |

FOREIGN PATENT DOCUMENTS

| | | | |
|---|---|---|---|
| EP | 0 549 246 A2 | 12/1992 | G11B/11/10 |
| EP | 0 549 246 A3 | 12/1992 | G11B/11/10 |

OTHER PUBLICATIONS

Thornton et al., *The influence of discharge current on the intrinsic stress in Mo films deposited using cylindrical and planar magnetron sputtering sources*, J. Vac. Sci. Tech. A 3 (3), pp. 576–579 (May/Jun. 1985).

Itoh et al., *The origin of stress in sputter–deposited tungsten films for x–ray masks*, 9 J. VAC. SCI. TECHNOL. 8, No. 1, pp. 149–153 (Jan/Feb 1991).

*Primary Examiner*—Steven H. VerSteeg
(74) *Attorney, Agent, or Firm*—Wells St. John P.S.

(57) ABSTRACT

The invention includes methods of forming a non-volatile resistance variable device and methods of forming a metal layer comprising silver and tungsten. A method of forming a non-volatile resistance variable device includes forming a chalcogenide material over a semiconductor substrate. First and second electrodes are formed operably proximate the chalcogenide material. At least one of the first and second electrodes includes a metal layer having silver and tungsten. The metal layer is formed by providing the substrate within a sputter deposition chamber. One or more target(s) is/are provided within the chamber which include(s) at least tungsten and silver. The one or more target(s) is/are sputtered using a sputtering gas comprising at least one of Xe, Kr and Rn under conditions effective to deposit the metal layer onto the substrate. The metal layer can be fabricated independent of fabrication of a non-volatile resistance variable device.

53 Claims, 1 Drawing Sheet

METHOD OF FORMING A NON-VOLATILE RESISTANCE VARIABLE DEVICE AND METHOD OF FORMING A METAL LAYER COMPRISING SILVER AND TUNGSTEN

TECHNICAL FIELD

This invention relates to methods of forming non-volatile resistance variable devices and to sputtering methods of forming a metal layer comprising silver and tungsten.

BACKGROUND OF THE INVENTION

Semiconductor fabrication continues to strive to make individual electronic components smaller and smaller resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in U.S. Pat. Nos. 5,761,115; 5,896,312; 5,914,893; and 6,084,796 to Kozicki et al., which ultimately resulted from U.S. patent application Ser. No. 08/652,706, filed on May 30, 1996, now U.S. Pat. No. 5,761,115 disclosing what is referred to as a programmable metallization cell. Such a cell includes opposing electrodes having an insulating dielectric material received therebetween. Received within the dielectric material is a variable resistance material. The resistance of such material can be changed between low resistance and high resistance states. In its normal high resistance state, to perform a write operation, a voltage potential is applied to a certain one of the electrodes with the other of the electrode being held at zero voltage or ground. The electrode having the voltage applied thereto functions as an anode, while the electrode held at zero or ground functions as a cathode. The nature of the resistance variable material is such that it undergoes a change at a certain applied voltage. With such voltage applied, a low resistance state is induced into the material such that electrical conduction can occur between the top and bottom electrodes.

Once this occurs, the low resistance state is retained when the voltage potentials are removed. Such can effectively result in the resistance of the mass of resistance variable material between the electrodes dropping by a factor of 1,000. Such material can be returned to its highly resistive state by reversing the voltage potential between the anode and cathode. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. One specific example includes one or more layers of germanium selenide having silver ions diffused therein and one or more layers of silver selenide having excess silver ions diffused therein. Typically in such example, one or both of the electrodes will comprise silver, for example elemental silver. One promising electrode material for such cells is a mixture or alloy of silver and tungsten. A primary motivation in this invention relates to improving sputtering techniques in forming at least one of the electrodes to comprise a metal layer comprising silver and tungsten.

SUMMARY

The invention includes methods of forming a non-volatile resistance variable device and methods of forming a metal layer comprising silver and tungsten. In one implementation, a method of forming a non-volatile resistance variable device includes forming a chalcogenide material over a semiconductor substrate. First and second electrodes are formed operably proximate the chalcogenide material. At least one of the first and second electrodes includes a metal layer comprising silver and tungsten. The metal layer is formed by providing the substrate within a sputter deposition chamber. One or more target(s) is/are provided within the chamber which include(s) at least tungsten and silver. The one or more target(s) is/are sputtered using a sputtering gas comprising at least one of Xe, Kr and Rn under conditions effective to deposit the metal layer onto the substrate. The invention contemplates fabrication of the metal layer independent of fabrication of a non-volatile resistance variable device.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
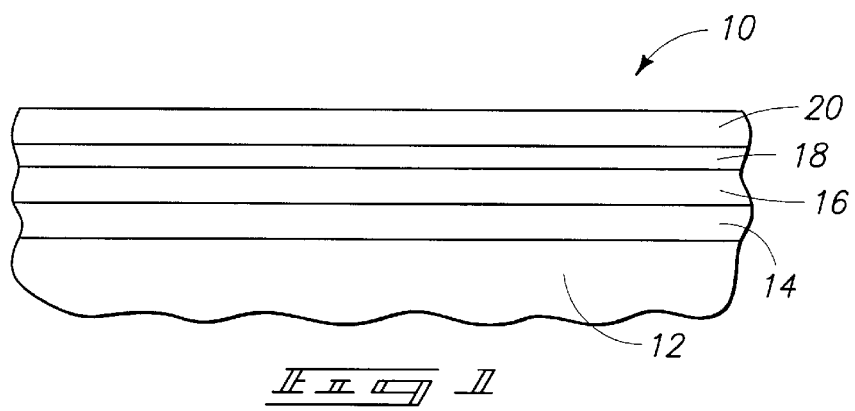
FIG. 1 is a diagrammatic perspective view of a semiconductor wafer fragment/section in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metallization cells and programmable optical elements of the patents referred to above, further by way of example only including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. Further by way of example only, the invention also contemplates forming non-volatile resistance variable devices into an analog memory device capable of being set and reset to a resistance value over a continuous range of resistance values which is measure of a voltage applied to it over a corresponding range of voltage values. By way of example only, such are disclosed in U.S. Pat. No. 5,360,981, which resulted from a serial number application 194,628, filed on May 4, 1990, listing Owen et al. as inventors. This '981 patent is fully herein incorporated by reference. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural. Further, it will be appreciated by the artisan that "resistance setable semiconductive material" and "resistance variable device" includes materials and devices wherein a property or properties in addition to resistance is/are also varied. For example, and by way of example only, the material's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A first electrode 16 is formed over dielectric layer 14. Any suitable conductive material or materials is/are contemplated, for example metals (in elemental, alloy or other mixture form) and metal compounds. An exemplary thickness range for first electrode 16 is from a few hundreds of Angstroms to tens of thousands of Angstroms thick.

A chalcogenide material 18 is formed over first electrode 16, and accordingly, over or as a part of semiconductor substrate 10. One exemplary preferred material for layer 18 is germanium selenide, which includes elemental silver or silver selenide therein. An exemplary thickness for chalcogenide material 18 is from 100 Angstroms to 1,000 Angstroms. A second electrode 20 is formed over chalcogenide material 18. Exemplary materials and thickness range are as described above with respect to first electrode 16. Such provides but one example of forming first and second electrodes operably proximate a chalcogenide material.

Figure 2:
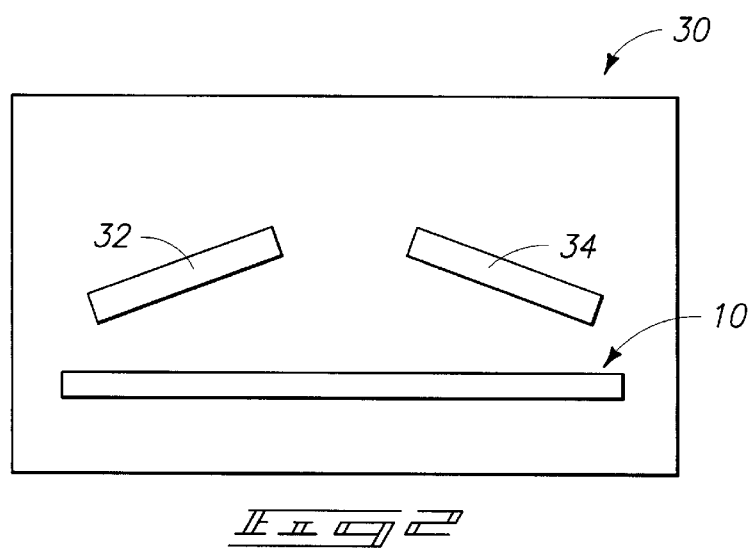
FIG. 2 is a diagrammatic view of a sputtering chamber.

In accordance with an aspect of the invention, at least one of the first and second electrodes 16, 20, respectively, is formed to comprise a metal layer containing silver and tungsten. Methods of forming such a metal layer in accordance with aspects of the invention are described with reference to FIGS. 2 and 3. Referring initially to FIG. 2, a sputter deposition chamber 30 is depicted. Any suitable sputtering chamber, whether existing or yet-to-be-developed, is contemplated. By way of example only, a preferred exemplary sputtering apparatus is a DC Magnetron System. One such exemplary system is that manufactured by Denton Vacuum of Moorestown, N.J. under the model name/number Denton Discovery 24. Substrate 10 is depicted as being received within sputter deposition chamber 30. One or more target(s) is/are provided within chamber 30 which comprise(s) at least tungsten and silver. If only a single target is provided with the chamber, such will comprise a mixture of tungsten and silver. If more than one target is provided within the chamber, each such target does not necessarily need to comprise both tungsten and silver, but collectively the targets must include a tungsten component and a silver component. FIG. 2 depicts a chamber 30 having two, and only two, targets 32 and 34 therein. Preferably, one of such targets in a preferred embodiment consists essentially of silver, with another of the targets consisting essentially of tungsten.

Argon was initially selected as a sputter gas of choice in forming an electrode material 16 or 20 to comprise an alloy or mixture of silver and tungsten. However, it was discovered that the silver concentration on the substrate in the metal layer formed was very low in silver composition. A substantially vertical shield was positioned on the substrate between the FIG. 2 illustrated targets, which respectively consisted essentially of elemental silver and elemental tungsten. Thus, the respective materials could be separately deposited on the substrate on opposing sides of the shield for analysis.

It was determined that, for the same argon energy, the sputter yield of silver deposition was much more than that of tungsten at 500 eV argon ion energy. Sputtering with such energy corresponded essentially to the dislodging of 2.8 silver atoms from the silver target for each argon atom that hit the silver target. With respect to tungsten, only 0.57 tungsten atoms were dislodged for each argon atom hitting the tungsten target. Tungsten has an atomic mass of approximately 183.9, while silver has an atomic mass of approximately 107.9. Argon has an atomic mass of approximately 39.9. It is theorized that, due to the large mass difference between tungsten in relation to that of argon, argon ions are reflected from the tungsten target compared to any reflection from the silver target.

Further during a sputter deposition, the kinetic energy of the sputtering gas ions is transferred to the target material. The lower the atomic mass of the sputtering gas compared to the atomic mass of the target, the less energy transfer apparently occurs to the target during the sputter procedure. Since the atomic weight of argon is much less than that of tungsten as compared to that of silver, the reflected argon also has considerable energy remaining. Accordingly with respect to the illustrated FIG. 2 system, the reflected argon is theorized to have sufficient energy to sputter off silver atoms from the substrate surface which were previously deposited by sputtering from the silver target. Further, it was noticed that the substrate was warmer during tungsten sputtering as compared to that of silver sputtering. This was further evidence indicating that the substrate was being bombarded by reflected argon atoms during the tungsten deposition.

Experiments conducted with neon by itself also yielded unacceptable results. Only 1.7 silver atoms were dislodged for each neon atom that hit the silver target at 500 eV, and only 0.28 tungsten atoms were dislodged for each neon atom hitting the tungsten target at 500 eV.

In accordance with the invention, one or more target(s) is/are sputtered within a sputter deposition chamber using a sputtering gas comprising at least one of Xe, Kr and Rn under conditions effective to deposit a metal layer comprising silver and tungsten onto the substrate. The sputtering gas might consist essentially of one or more of Xe, Kr and Rn. Further, the sputtering gas might comprise or consist essentially of a mixture of at least two of Xe, Kr and Rn. Further still, the sputtering might gas comprise another gas other than Xe, Kr and Rn.

Xenon is the most preferred gas to utilize of the Xe, Kr and Rn group due to efficiency of silver deposition and for reducing reflection energy. Silver concentration in the deposition was significantly increased to just under seven times more than sputtering with argon alone.

In reduction-to-practice examples, production grade silicon wafers having either thermal silicon nitride or silicon dioxide deposited by decomposition of tetraethylorthosilicate where chosen as the deposition substrates. The sputter deposition system utilized was the Denton Discovery 24 System, which was capable of co-sputtering up to four different materials. Two different targets were utilized during the sputtering, one constituting elemental silver and the other constituting elemental tungsten, with each having a purity of at least 99.999 atomic percent. Sputter deposition conditions were chosen in an effort to obtain a silver to tungsten deposition rate ratio of 1:2 atomic (in otherwords, 33% atomic silver) assuming no secondary sputtering of the reflected sputtering agent from the targets. Thereafter, the silver and tungsten atomic concentration in the deposited layer was measured by x-ray photoelectron spectroscopy. The deposited layers consisted essentially of a mixture of silver and tungsten. Using argon as a sole sputtering gas, the silver concentration in the deposited layer was only 2.3% (atomic). Using neon alone, the silver concentration yield was only 3.5%. However, utilizing xenon alone achieved a significantly higher and improved silver concentration of 17.6%.

Figure 3:
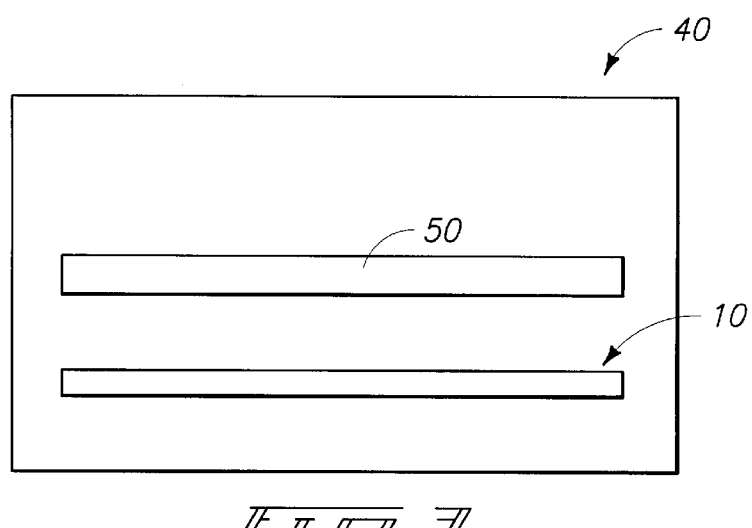
FIG. 3 is a diagrammatic view of another sputtering chamber.

FIG. 3 diagrammatically illustrates an alternate embodiment sputter deposition chamber 40 comprising a single target 50 which would comprise a mixture of tungsten and silver.

As alluded to above, the invention also contemplates sputtering the target or targets using a mixture of two or more gases. One specific preferred mixture comprises xenon and argon, with such a sputtering gas mixture in one preferred embodiment consisting essentially of xenon and argon.

In accordance with one preferred aspect of the invention, the invention further contemplates determining a sputtering gas mixture of xenon and argon (whether alone or in combination with other gases) which, under selected sputtering conditions, will achieve a sputter deposition of a metal layer consisting essentially of selected amounts of silver and tungsten on the semiconductor substrate using the one or more target(s). Such might be determined theoretically or in actual practice from experimental results, or by other methods whether existing or yet-to-be-developed. Regardless, in accordance with this particular preferred aspect of the invention, the one or more target(s) is/are then sputtered using the sputtering gas mixture and conditions effective to deposit the metal layer consisting essentially of silver and tungsten onto the semiconductor substrate. The sputtering gas mixture might comprise more xenon than argon by volume, more argon than xenon by volume, or equal proportions of xenon and argon by volume. The greater the quantity of argon, the greater the expected concentration of tungsten (alternately considered, the reduced concentration of silver) in the deposited layer.

Exemplary preferred concentrations of silver within a layer consisting essentially of silver and tungsten in the preferred embodiment are from 10% to 50% silver (atomic). By way of example only, a preferred pressure range for the sputtering is from 1 mTorr to 50 mTorr. Specific preferred example processing range conditions for the Denton Discovery 24 System are a tungsten power of from 300 watts to 1000 watts and a silver power of from 100 watts to 600 watts. Preferably, sputtering is conducted at room temperature at a pressure of from about 1 mTorr to 30 mTorr. An exemplary flow rate of the xenon during sputtering is from 20 sccm to 50 sccm.

The invention also contemplates sputtering methods of forming a metal layer independent of the fabrication of a non-volatile resistance variable device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a non-volatile resistance variable device, comprising:
    forming a chalcogenide material over a semiconductor substrate; and
    forming first and second electrodes operably proximate the chalcogenide material, at least one of the first and second electrodes comprising a metal layer comprising silver and tungsten, the metal layer being formed by:
        providing the substrate within a sputter deposition chamber;
        providing one or more target(s) within the chamber which comprise(s) at least tungsten and silver; and
        sputtering the one or more target(s) using a sputtering gas comprising at least one of Xe, Kr and Rn under conditions effective to deposit the metal layer onto the substrate.

2. The method of claim 1 wherein one target within the chamber comprises a mixture of tungsten and silver.

3. The method of claim 1 wherein only a single target is provided within the chamber, the single target comprising a mixture of tungsten and silver.

4. The method of claim 1 wherein only a single target is provided within the chamber, the single target comprising a mixture of tungsten and silver, and wherein the sputtering gas comprises Xe.

5. The method of claim 1 wherein at least two targets are provided within the chamber, one of the targets consisting essentially of silver, another of the targets consisting essentially of tungsten.

6. The method of claim 1 wherein at least two targets are provided within the chamber, one of the targets consisting essentially of silver, another of the targets consisting essentially of tungsten, and wherein the sputtering gas comprises Xe.

7. The method of claim 1 wherein only two targets are provided within the chamber, one of the targets consisting essentially of silver, another of the targets consisting essentially of tungsten.

8. The method of claim 1 wherein the sputtering gas comprises Xe.

9. The method of claim 1 wherein the sputtering gas comprises Kr.

10. The method of claim 1 wherein the sputtering gas comprises Rn.

11. The method of claim 1 wherein the sputtering gas consists essentially of one or more of Xe, Kr, and Rn.

12. The method of claim 1 wherein the sputtering gas comprises a mixture of at least two of Xe, Kr, and Rn.

13. The method of claim 1 wherein the sputtering gas comprises another gas other than Xe, Kr, and Rn.

14. The method of claim 1 wherein the conditions comprise DC magnetron sputtering.

15. The method of claim 1 wherein the sputtering is effective to form the metal layer to consist essentially of silver and tungsten.

16. The method of claim 1 wherein the sputtering gas comprises Xe and Ar, and further comprising determining a sputtering gas mixture of Xe and Ar which under selected sputtering conditions will achieve a sputter deposition of a metal layer consisting essentially of selected amounts of silver and tungsten on the semiconductor substrate using the one or more target(s), and sputtering the one or more target(s) using the sputtering gas mixture and conditions effective to deposit the metal layer consisting essentially of silver and tungsten onto the semiconductor substrate.

17. The method of claim 16 wherein the sputtering gas mixture comprises more Xe than Ar by volume.

18. The method of claim 16 wherein the sputtering gas mixture comprises more Ar than Xe by volume.

19. The method of claim 16 wherein the sputtering gas mixture consists essentially of Xe and Ar.

20. The method of claim 19 wherein the sputtering gas mixture comprises more Xe than Ar by volume.

21. The method of claim 19 wherein the sputtering gas mixture comprises more Ar than Xe by volume.

22. A sputtering method of forming a metal layer comprising silver and tungsten, comprising:
   providing a semiconductor substrate within a sputter deposition chamber;
   providing one or more target(s) within the chamber which comprise(s) at least tungsten and silver; and
   sputtering the one or more target(s) using a sputtering gas comprising at least one of Xe, Kr and Rn under conditions effective to deposit a metal layer comprising silver and tungsten onto the semiconductor substrate.

23. The method of claim 22 wherein one target within the chamber comprises a mixture of tungsten and silver.

24. The method of claim 22 wherein only a single target is provided within the chamber, the single target comprising a mixture of tungsten and silver.

25. The method of claim 22 wherein at least two targets are provided within the chamber, one of the targets consisting essentially of silver, another of the targets consisting essentially of tungsten.

26. The method of claim 22 wherein only two targets are provided within the chamber, one of the targets consisting essentially of silver, another of the targets consisting essentially of tungsten.

27. The method of claim 22 wherein the sputtering gas comprises Xe.

28. The method of claim 22 wherein the sputtering gas comprises Kr.

29. The method of claim 22 wherein the sputtering gas comprises Rn.

30. The method of claim 22 wherein the sputtering gas consists essentially of one or more of Xe, Kr, and Rn.

31. The method of claim 22 wherein the sputtering gas comprises a mixture of at least two of Xe, Kr, and Rn.

32. The method of claim 22 wherein the sputtering gas comprises another gas other than Xe, Kr, and Rn.

33. The method of claim 22 wherein the conditions comprise DC magnetron sputtering.

34. The method of claim 22 wherein the sputtering is effective to form the metal layer to consist essentially of silver and tungsten.

35. A sputtering method of forming a metal layer comprising silver and tungsten, comprising:
   providing a semiconductor substrate within a sputter deposition chamber;
   providing at least two targets within the chamber, one of the targets consisting essentially of silver, another of the targets consisting essentially of tungsten; and
   sputtering the targets using a sputtering gas comprising Xe under conditions effective to deposit a metal layer comprising silver and tungsten onto the semiconductor substrate.

36. The method of claim 35 wherein the sputtering gas consists essentially of Xe.

37. The method of claim 35 wherein the sputtering gas comprises Xe and Ar.

38. The method of claim 35 wherein the sputtering gas comprises Xe and at least one of Kr and Rn.

39. The method of claim 35 wherein the sputtering is effective to form the metal layer to consist essentially of silver and tungsten.

40. A sputtering method of forming a metal layer comprising silver and tungsten, comprising:
   providing a semiconductor substrate within a sputter deposition chamber;
   providing a target within the chamber comprising silver and tungsten; and
   sputtering the target using a sputtering gas comprising Xe under conditions effective to deposit a metal layer comprising silver and tungsten onto the semiconductor substrate.

41. The method of claim 40 wherein the sputtering gas consists essentially of Xe.

42. The method of claim 40 wherein the sputtering gas comprises Xe and Ar.

43. The method of claim 40 wherein the sputtering gas comprises Xe and at least one of Kr and Rn.

44. The method of claim 40 wherein the sputtering is effective to form the metal layer to consist essentially of silver and tungsten.

45. A sputtering method of forming a metal layer consisting essentially of silver and tungsten, comprising:
   providing a semiconductor substrate within a sputter deposition chamber;
   providing one or more target(s) within the chamber which comprise(s) at least tungsten and silver;
   determining a sputtering gas mixture of Xe and Ar which under selected sputtering conditions will achieve a sputter deposition of a metal layer consisting essentially of selected amounts of silver and tungsten on the semiconductor substrate using the one or more target(s); and
   sputtering the one or more target(s) using the sputtering gas mixture and conditions effective to deposit the metal layer onto the semiconductor substrate.

46. The method of claim 45 wherein the sputtering gas mixture comprises more Xe than Ar by volume.

47. The method of claim 45 wherein the sputtering gas mixture comprises more Ar than Xe by volume.

48. The method of claim 45 wherein one target within the chamber comprises a mixture of tungsten and silver.

49. The method of claim 45 wherein only a single target is provided within the chamber, the single target comprising a mixture of tungsten and silver.

50. The method of claim 45 wherein at least two targets are provided within the chamber, one of the targets consisting essentially of silver, another of the targets consisting essentially of tungsten.

51. The method of claim 45 wherein the sputtering gas mixture consists essentially of Xe and Ar.

52. The method of claim 51 wherein the sputtering gas mixture comprises more Xe than Ar by volume.

53. The method of claim 51 wherein the sputtering gas mixture comprises more Ar than Xe by volume.

* * * * *

UNITED STATES PATENT AND TRADEMARK OFFICE
CERTIFICATE OF CORRECTION

PATENT NO. : 6,660,136 B2
DATED : December 9, 2003
INVENTOR(S) : Jiutao Li et al.

It is certified that error appears in the above-identified patent and that said Letters Patent is hereby corrected as shown below:

Column 4,
Line 50, replace "still, the sputtering might gas comprise another gas other" with
-- still, the sputtering gas might comprise another gas other --

Signed and Sealed this

Third Day of August, 2004

JON W. DUDAS
*Acting Director of the United States Patent and Trademark Office*